United States Patent
Truessel et al.

(10) Patent No.: US 8,013,435 B2
(45) Date of Patent: Sep. 6, 2011

(54) SEMICONDUCTOR MODULE

(75) Inventors: Dominik Truessel, Bremgarten (CH);
Daniel Schneider, Bellikon (CH)

(73) Assignee: ABB Technology AG, Zurich (CH)

( * ) Notice: Subject to any disclaimer, the term of this patent is extended or adjusted under 35 U.S.C. 154(b) by 27 days.

(21) Appl. No.: 12/689,746

(22) Filed: Jan. 19, 2010

(65) Prior Publication Data

US 2010/0117223 A1 May 13, 2010

Related U.S. Application Data

(63) Continuation of application No. PCT/EP2008/059258, filed on Jul. 16, 2008.

(30) Foreign Application Priority Data

Jul. 20, 2007 (EP) .................................. 07112854

(51) Int. Cl.
H01L 23/12 (2006.01)
(52) U.S. Cl. ........ 257/704; 257/790; 257/791; 257/793; 257/E23.18
(58) Field of Classification Search .......... 257/678–734, 257/787–796, E23.001–E23.194, 924, E21.5, 257/21.501
See application file for complete search history.

(56) References Cited

U.S. PATENT DOCUMENTS

| 5,977,621 | A | 11/1999 | Stuck |
| 7,838,897 | B2 * | 11/2010 | Higashi et al. .................. 257/99 |
| 2003/0089974 | A1 | 5/2003 | Matsuo et al. |

FOREIGN PATENT DOCUMENTS

| DE | 10123232 A1 | 11/2002 |
| FR | 2518812 A | 6/1983 |
| JP | 63-143850 | * 6/1988 |
| JP | 10-233472 A | 9/1998 |

OTHER PUBLICATIONS

Notification Concerning Transmittal of International Preliminary Report on Patentability (Forms PCT/IB/326 and PCT/IB/373) and the Written Opinion of the International Searching Authority (Form PCT/ISA/237) issued in corresponding International Application No. PCT/EP2008/059258 dated Feb. 4, 2010.
International Search Report (PCT/ISA/210) for PCT/EP2008/059258 mailed Oct. 16, 2008.
European Search Report for EP 07112854.0 dated Jun. 6, 2008.

\* cited by examiner

*Primary Examiner* — Jasmine J Clark
(74) *Attorney, Agent, or Firm* — Buchanan Ingersoll & Rooney PC

(57) ABSTRACT

A semiconductor module includes a base plate, at least one semiconductor chip mounted on the base plate, a case fixed to the base plate and surrounding the at least one semiconductor chip, an electrically insulating gel layer covering the at least one semiconductor chip, a thermosetting resin layer formed on top of the gel layer, and a lid formed on top of the thermosetting resin layer. The lid comprises a lid-extension, which defines a lid-opening. The lid-opening extends through the thermosetting resin layer to the gel layer and allows gel of the gel layer to expand into the lid-opening.

20 Claims, 1 Drawing Sheet

SEMICONDUCTOR MODULE

RELATED APPLICATIONS

This application claims priority as a continuation application under 35 U.S.C. §120 to PCT/EP2008/059258, which was filed as an International Application on Jul. 16, 2008 designating the U.S., and which claims priority to European Application 07112854.0 filed in Europe on Jul. 20, 2007. The entire contents of these applications are hereby incorporated by reference in their entireties.

FIELD

The present disclosure relates to the field of power electronics and more particularly to a semiconductor module.

BACKGROUND INFORMATION

Semiconductor modules for high power applications can comprise a housing and semiconductor chips sealed inside the housing. The housing has side walls, and the housing is closed on one side of the side walls by a base plate, on which the semiconductor chips are arranged. The housing is closed on the opposite side with a lid. In the housing, electrically insulating silicone gel filler is inserted, thus covering the chips. The lid, together with the packaging resin, seals the housing from the top. Typically, electrical terminals for electrically contacting the chips are soldered on the base plate. The terminals lead from the base plate through the gel, the hardened resin and the lid.

For manufacturing, the gel is filled into the housing at room temperature and is cured at an enhanced temperature, e.g., at about 125° C. A packaging resin is filled and cured on the gel filler. The resin is also cured at an enhanced temperature, e.g., at about 125° C. Therefore, the gel is thermally expanded when filling in the resin, and the gel shrinks when the module cools down. As the gel sticks to the resin, cracks emerge in the gel. These cracks can lead to partial discharge, thereby damaging or even destroying the module.

JP 10-233472 shows a semiconductor device module with means to reduce such cracks. This module comprises a housing with side walls. One side of the side walls are closed by a base plate, and the opposite side are closed with a lid. Semiconductor chips are arranged on the base plate. In the housing, silicone gel filler is inserted, thus covering the chips. A packaging resin is filled and cured on the gel filler. The lid, together with the packaging resin, seals the housing from the top. The housing has an L-shaped projection extending from the side walls into the housing. The projection is open to the gel filler, thus forming a space within the housing which is completely sealed against the surrounding. If the gel is expanded due to heat, excess pressure is produced in the air-filled space by the expanding gel and the gel presses against the lid and the packaging resin.

SUMMARY

An exemplary embodiment of the present disclosure provides a semiconductor module which includes a base plate, at least one semiconductor chip mounted on the base plate, a case fixed to the base plate and surrounding the at least one semiconductor chip, an electrically insulating gel layer covering the at least one semiconductor chip, a thermosetting resin layer formed on top of the gel layer, and a lid formed on top of the thermosetting resin layer. The lid comprises a lid-extension which defines a lid-opening. The lid-opening extends through the thermosetting resin layer to the gel layer and allowing gel of the gel layer to expand into the lid-opening.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
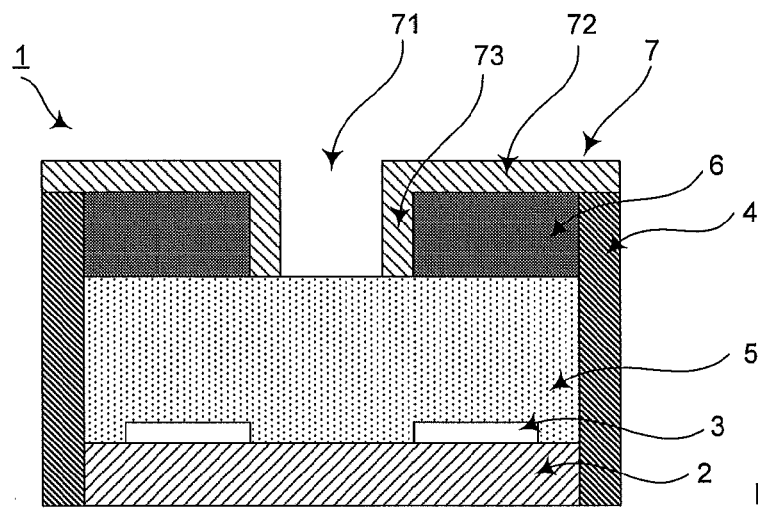
FIG. 1 shows a cross sectional view of an exemplary semiconductor module according to at least one embodiment of the present disclosure.

Exemplary embodiments of the present disclosure provide a power semiconductor module with a case filled with a gel layer, and a hardened resin formed over the gel layer, such that cracks in the gel due to thermal expansion are avoided.

The semiconductor module comprises a base plate, at least one semiconductor chip mounted on the base plate, a case fixed to the base plate and surrounding the at least one semiconductor chip, an electrically insulating gel layer covering the at least one semiconductor chip, a thermosetting resin layer formed on top of the gel layer, and a lid formed on top of the thermosetting resin layer. The lid comprises a lid-opening, which defines a lid-opening. The lid-opening extends through the thermosetting resin layer to the gel layer and allows the gel of the gel layer to expand into the lid-opening.

By having a lid with such a lid-opening, the gel of the electrically insulating gel layer can expand in case of heat within the lid-opening so that the gel can expand more easily. Furthermore, in sealing gas-tight the gel layer from the surrounding environment, there is no vacuum or excess-pressure in the volume defined by the lid-opening, thereby allowing easy pressure compensation.

The reference symbols used in the drawings and their meaning are summarized in the following description of exemplary embodiments and the list of reference symbols below. Generally, the same or similarly-functioning parts are given the same reference symbols. The embodiments described below are meant as examples of implementations, and the present disclosure shall not be confined thereto.

FIG. 1 shows a cross sectional view of an exemplary semiconductor module 1 according to at least one embodiment of the present disclosure. As shown in FIG. 1, the exemplary semiconductor module 1 comprises a base plate 2, at least one semiconductor chip 3 mounted on the base plate 2, a case 4 fixed to the base plate 2 and surrounding the at least one semiconductor chip 3, an electrically insulating gel layer 5 covering the at least one semiconductor chip 3, a thermosetting resin layer 6 formed on top of gel layer 5, and a lid 7 formed on top of the thermosetting resin layer 6. The material of the gel layer 5 can be a silicone gel, for example. The material of the thermosetting resin layer 6 can be an epoxy resin, for example.

The lid 7 includes a lid-member 72 that is formed on top of the thermosetting resin layer 6. In addition, the lid 7 includes a lid-extension 73, which extends from the lid-member 72 and which defines a lid-opening 71. The lid-opening 71 extends through the thermosetting resin layer 6 to the gel layer 5 and enables the gel of the gel layer 5 to extend through the lid-opening 71.

According to an exemplary embodiment, the lid-opening 71 allows gas convection. For instance, the lid-opening 71 is open to the surrounding environment so that the pressure within the lid-opening 71 is balanced, i.e. the same as in the environment at any time, and gas can thereby pass over the lid 7 and into and/or through the lid-opening 71.

In another exemplary embodiment, the lid-opening 71 lies within an area, which is located outside the orthogonal projection of the area in which the at least one chip 3 is located. This location is advantageous, because in case of an explosion, which typically originates in the semiconductor chips 3, the thermosetting resin layer 6 and the lid 7 prevent the explosion from being directed downward toward the base plate 2. Instead, the energy is absorbed by the thermosetting resin layer 6 and the lid 7, thereby protecting people or other equipment in the vicinity of the module 1.

Figure 2:
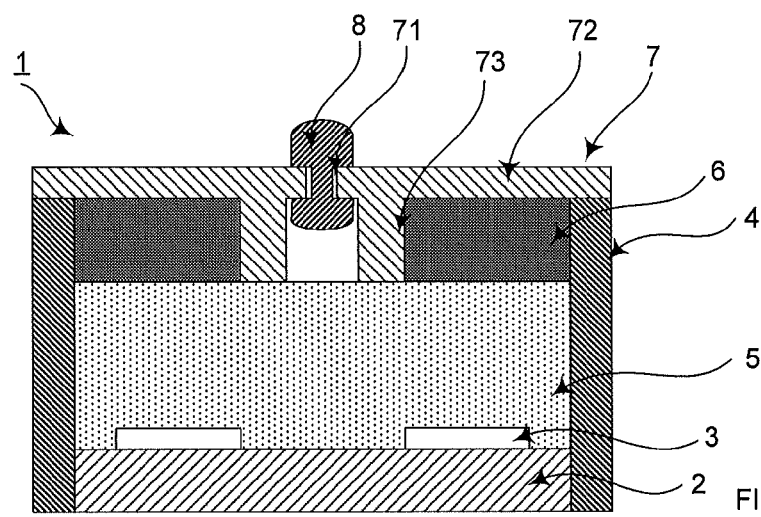
FIG. 2 shows a cross sectional view of another exemplary embodiment of semiconductor module according to at least one embodiment of the present disclosure.

FIG. 2 shows a cross sectional view of an exemplary semiconductor module according to at least one embodiment of the present disclosure. As shown in FIG. 2, the lid-opening 71 is closed by a cover 8, which can be constituted by a rivet, for example. The cover 8 allows gas to pass over the cover 8 to compensate for a change of gas pressure, such as due to a temperature change in the module 1, so that pressure within the lid-opening 71 under the cover 8 and above the thermosetting resin layer 6 is balanced with the environment pressure. Such a cover 8 prevents dust or other undesired particles from entering the module 1, and avoids under- or excess-pressure in case of a temperature rise or sinking. According to an exemplary embodiment, the rivet, as an example of the cover 8, can be made of plastic or any other electrically insulating material. To facilitate easier manufacturing, the rivet can be made as a blind rivet, which can be mounted from the outer side of the module 1. One-piece blind rivets, such as rivet plugs or slit rivets, as well as two-piece blind rivets, such a two-piece slit rivets, can be utilized.

Figure 3:
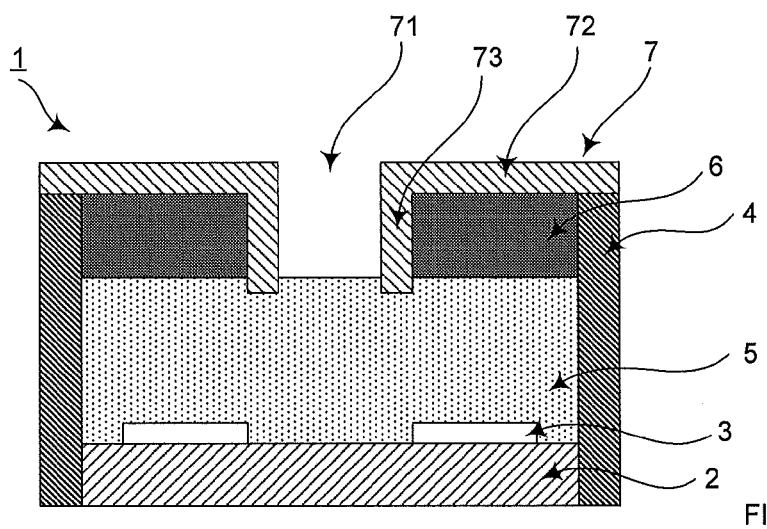
FIG. 3 shows a cross sectional view of another exemplary embodiment of semiconductor module according to at least one embodiment of the present disclosure.

FIG. 3 shows a cross sectional view of an exemplary semiconductor module according to at least one embodiment of the present disclosure. In the exemplary embodiment shown in FIG. 3, the lid-extension 73 extends into the gel layer 5. This makes the manufacturing of the module 1 easier, because less mechanical accuracy is required. During manufacturing, after curing of the gel of the gel layer 5 at an enhanced temperature, the gel cools down and therefore sags within the lid-opening 71. The lid-extension 73 extending into the gel layer 5 ensures that the thermosetting resin of the resin layer 6, when filled in after having cooled down the gel, cannot flow into the lid opening 71 even if the gel has sagged.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

1 Semiconductor module
2 Base plate
3 Semiconductor chip
4 Case
5 Electrically insulating gel layer
6 Thermosetting resin layer
7 Lid
8 Cover
71 Lid-opening
72 Lid-member
73 Lid-extension

What is claimed is:

1. A semiconductor module comprising:
a base plate;
at least one semiconductor chip mounted on the base plate;
a case fixed to the base plate and surrounding the at least one semiconductor chip;
an electrically insulating gel layer covering the at least one semiconductor chip;
a thermosetting resin layer formed on top of the gel layer; and
a lid formed on top of the thermosetting resin layer,
wherein the lid comprises a lid-extension which defines a lid-opening, the lid-opening extending through the thermosetting resin layer to the gel layer and allowing gel of the gel layer to expand into the lid-opening.

2. A semiconductor module according to claim 1, wherein the gel layer is constituted by a silicone gel.

3. A semiconductor module according to claim 1, wherein the lid-extension extends into the gel layer.

4. A semiconductor module according to claim 1, wherein the lid-opening lies within an area, which is located outside an orthogonal projection of an area in which the at least one semiconductor chip is located.

5. A semiconductor module according to claim 1, wherein the lid-opening is open to an environment surrounding the semiconductor module.

6. A semiconductor module according to claim 1, wherein the lid-opening is closed by a cover.

7. A semiconductor module according to claim 6, wherein the cover is a rivet.

8. A semiconductor module according to claim 7, wherein the rivet is a blind rivet.

9. A semiconductor module according to claim 7, wherein the rivet is constituted by electrically insulating material.

10. A semiconductor module according to claim 6, wherein the cover is configured to allow gas to pass thereover to compensate for a change of pressure in the module.

11. A semiconductor module according to claim 1, wherein the thermosetting resin layer is constituted by an epoxy resin.

12. A semiconductor module according to claim 2, wherein the thermosetting resin layer is constituted by an epoxy resin.

13. A semiconductor module according to claim 2, wherein the lid-extension extends into the gel layer.

14. A semiconductor module according to claim 3, wherein the lid-opening lies within an area, which is located outside an orthogonal projection of an area in which the at least one semiconductor chip is located.

15. A semiconductor module according to claim 4, wherein the lid-opening is open to an environment surrounding the semiconductor module.

16. A semiconductor module according to claim 8, wherein the rivet is one of a one-piece blind rivet and a two-piece blind rivet.

17. A semiconductor module according to claim 8, wherein the rivet is constituted by an electrically insulating material.

18. A semiconductor module according to claim 9, wherein the rivet is constituted by plastic.

19. A semiconductor module according to claim 6, wherein the cover is configured to allow gas to pass thereover to compensate for a change of pressure in the module due to a change in temperature in the module.

20. A semiconductor module according to claim 7, wherein the cover is configured to allow gas to pass thereover to compensate for a change of pressure in the module.

* * * * *